United States Patent [19]
Elwell

[11] Patent Number: 5,394,035
[45] Date of Patent: Feb. 28, 1995

[54] RATE OF CHANGE COMPARATOR

[75] Inventor: Brian E. Elwell, Brentwood, Calif.

[73] Assignee: Novitas, Incorporated, Culver City, Calif.

[21] Appl. No.: 112,085

[22] Filed: Aug. 25, 1993

[51] Int. Cl.$^6$ .......................... H03F 3/45; H03K 5/22
[52] U.S. Cl. .................................... 327/72; 340/541;
340/661; 327/14; 327/68
[58] Field of Search ............... 307/236, 268, 356, 494,
307/542, 595, 602; 340/541, 555, 561, 562, 565,
567, 573, 661

[56] References Cited

U.S. PATENT DOCUMENTS

| | | | |
|---|---|---|---|
| 3,825,775 | 7/1974 | Welsh | 307/268 |
| 4,013,964 | 3/1977 | Skutta | 325/319 |
| 4,377,808 | 3/1983 | Kao | 340/527 |
| 4,539,488 | 9/1985 | Lehnert | 307/261 |
| 5,309,147 | 5/1994 | Lee et al. | 340/567 |

Primary Examiner—John S. Heyman
Assistant Examiner—Jeffrey Zweizig
Attorney, Agent, or Firm—Robbins, Berliner & Carson

[57] ABSTRACT

A rate of change comparator uses an RC charging circuit and a separate RC discharging circuit to follow a transducer output. The resistor component of each RC circuit is shunted by a diode, each biased in a different orientation so that the charging circuit charges quickly through its diode but discharges slowly through its resistor and the discharging circuit discharges quickly through its diode and slowly through its resistor. The difference in output between the charging and discharging circuits is detected with a comparator, biased off by a threshold bias voltage developed from one of the circuits. The comparator is unaffected by slow changes in transducer signals due to drift, ambient condition and similar changes because the differential voltage between the circuits is minimized for transducer signal changes below the level set by a threshold bias level. When the transducer signal is positive and the rate of change of the transducer signal exceeds the minimum rate of change set by the RC time constant of the discharging circuit, the diode allows the charging circuit to charge faster than the discharging circuit and the differential voltage therebetween triggers the comparator to indicate that an event was detected if the differential voltage exceeds the threshold bias voltage. Similarly, when the transducer signal is negative and the rate of change of the transducer signal exceeds the minimum rate of change set by the RC time constant of the charging circuit, the diode allows the discharging circuit to discharge faster than the charging circuit and the differential voltage therebetween triggers the comparator to indicate that an event was detected if the differential voltage exceeds the threshold bias voltage.

24 Claims, 1 Drawing Sheet

RATE OF CHANGE COMPARATOR

BACKGROUND OF THE INVENTION

1. Field of the Invention

This invention relates generally to comparators used to determine when a signal exceeds a predetermine setpoint. This invention relates specifically to comparators used to determine when a signal of unknown polarity exceeds a predetermined change in value. In particular, the present invention relates to comparators used to determine when transducers, such as pyroelectric sensors or ultrasonic/acoustic transducers, used for example as motion sensors, have detected the occurrence of an event they have been designed to detect. Such transducers may be used as occupancy sensors to control lighting, heating, cooling and/or other systems in response to the occupancy of a room.

2. Description of the Prior Art

Conventional transducers used as motion and/or occupancy sensors may operate passively, by detecting changes in ambient conditions such as changes in temperature, occasioned by the entry of a warm bodied being into a room. Alternatively, conventional transducers may operate actively by flooding the environment to be monitored with transmitted and reflected energy and then detecting changes in the resultant steady state energy reception pattern observed by the transducer from the monitored environment in order to detect the event to be monitored.

Conventional occupancy sensors tend to be sensitive to changes in ambient conditions not intended to be detected, such as changes in temperature and even air densities, that interfere with their ability to accurately detect events to be monitored. When used as occupancy detectors, for example, the transducers must be sufficiently sensitive to detect minor motions, such as the movement of a human arm through a specified arc, without falsely being triggered by other events such as changes in the ambient conditions occasioned by thermal or other drift.

The polarity of the change of the output signal of a transducer used in an occupancy sensor will typically not be known before it occurs because the motions or other events to be detected may occur in any direction. The event to be detected cannot therefore be conveniently determined by comparison against a single set point because the direction of change of the signal, that is, the polarity of the transducer signal, cannot be predicted before the event. The transducer output signal must therefore be compared against set points for each polarity, typically both an upper and a lower setpoint value. If the transducer output is above the upper setpoint or below the lower setpoint, the event to be monitored is indicated to be detected. Conventionally, the outputs of transducers used in occupancy sensors are applied to a window comparator to determine if the transducer signal exceeds the upper or lower threshold or setpoint.

Systems using conventional circuits, such as window comparators, are especially susceptible to errors including false detections, from thermal drift and other long term ambient changes. Such ambient changes may mask the signal to be detected and may be caused by temperature changes during the day, changes in the operation of heating and air conditioning equipment as well as even changes in humidity.

What are needed are convenient techniques suitable for detecting events of unknown signal polarities from the outputs of transducers used, for example, in occupancy sensors.

SUMMARY OF THE INVENTION

The preceding and other shortcomings of prior art systems are addressed and overcome by the present invention that detects when the rate of change of the signal being monitored, such as a transducer output, exceeds a predetermined rate of change and a threshold amplitude. In other words, an event is detected when the transducer output signal changes more than the threshold amplitude within a time frame specified by a minimum rate of change.

The detection is accomplished by a rate of change comparator responsive to the output of the transducer, such as an infrared or ultrasonic/acoustic transducer, used as a motion sensor. The transducer output is applied to both inputs of a comparator such as an operational amplifier or op amp. The first comparator input is provided by the voltage across a capacitor in a series resistor-capacitor or RC circuit, described herein as a fast discharging circuit, in which a diode is shunted across the resistor so that the capacitor charges in accordance with the RC time constant when the transducer output is positive, but the capacitor discharges at a much faster rate through the diode when the transducer output is negative. The resistance may be adjustable to adjust the minimum rate of change required for detection when the transducer output signal is positive.

The second comparator input is provided by the voltage across another capacitor in a second series RC circuit, described herein as a fast charging circuit, in which a diode is shunted across the resistor so that the capacitor discharges in accordance with the RC time constant when the transducer output is negative, but the capacitor charges at a much faster rate through the diode when the transducer output is positive. This resistance may also be adjustable to adjust the minimum rate of change required for detection when the transducer output signal is negative.

In operation, when the transducer output changes more slowly than the RC time constant of the relevant comparator input, both capacitors are maintained at approximately the same voltage level so that the differential voltage applied across the op amp input is small. When, however, the transducer output changes dramatically in either direction at a rate of change greater than the RC time constant of the comparator inputs, one of the capacitors will charge or discharge slowly at the RC time constant rate while the other capacitor will charge or discharge much more quickly through the appropriate diode. The difference in the voltages applied by the two capacitors will therefore change sufficiently to apply a larger than normal differential voltage of the same polarity across the op amp inputs. The op amp is biased into the off state by a small threshold bias voltage so that the difference in voltages applied by the two capacitors must exceed this threshold voltage in order to trigger an output indication by the op amp.

It is important to note that the polarity of the output remains the same for a detected event without regard to the polarity of the transducer input indicating that event.

In order to provide the threshold bias for the the op amp, one of the comparator inputs, includes a voltage reducing circuit, such as a voltage divider circuit in the form of a pair of resistors or in the form of an adjustable potentiometer. In one embodiment of the present invention, the non-inverting input of the op amp comparator is applied to the center tap or wiper of an adjustable voltage divider shunted across the capacitor. In this way, a predetermined portion of the voltage across that capacitor is used to bias the op amp off, thereby setting a threshold amplitude at the predetermined rate of change. In other words, the transducer output has to exceed the rate of change specified by the RC inputs by an amount greater than the threshold voltage specified by the voltage divider in order to change the state of the output of the op amp by turning it on, thereby indicating that an event was detected.

In a first aspect, the present invention provides a comparator including a fast charging circuit to produce a fast charging circuit voltage in response to an applied voltage signal having a variable rate of change, the fast charging circuit voltage increasing at a relatively fast charging rate when the applied voltage signal has a first polarity with respect to a reference voltage and decreasing at a relatively slower charging rate when the applied voltage signal has a second polarity with respect to the reference voltage, a fast discharging circuit to produce a fast discharging circuit voltage in response to the applied voltage signal, the fast discharging circuit voltage increasing at a relatively slow discharging rate when the applied voltage signal has the first polarity with respect to the reference voltage and decreasing at a relatively faster discharging rate when the applied voltage signal has the second polarity with respect to the reference voltage, and a differential amplifier or comparator for comparing a first portion of the fast charging circuit voltage to a second portion of the fast discharging circuit voltage to produce an output signal when the rate of change of the applied voltage signal exceeds a predetermined rate of change.

In another aspect, the present invention provides a motion detector producing a transducer signal responsive in magnitude and polarity to a motion to be detected, a fast charging circuit to produce a charging voltage in response to the transducer signal, the charging voltage increasing at a relatively fast charging circuit rate when the transducer signal has a first polarity and decreasing at a relatively slower charging circuit rate when the transducer signal has a second polarity, a fast discharging circuit to produce a discharging voltage in response to the transducer signal, the discharging voltage increasing at a relatively slow discharging circuit rate when the transducer signal has the first polarity and decreasing at a relatively faster discharging circuit rate when the transducer signal has the second polarity, a comparator amplifier for comparing a first portion of the fast charging circuit voltage to a second portion of the fast discharging circuit voltage to produce an output signal when the rate of change of the transducer signal exceeds a predetermined rate of change, and an output indicator responsive to the output signal to indicate the detection of motion.

The foregoing and additional features and advantages of this invention will become further apparent from the detailed description and accompanying drawing figure that follows. In the figure and written description, numerals indicate the various features of the invention, like numerals referring to like features throughout for both the drawing figure and the written description.

DETAILED DESCRIPTION OF PREFERRED EMBODIMENT(S)

Figure 1:
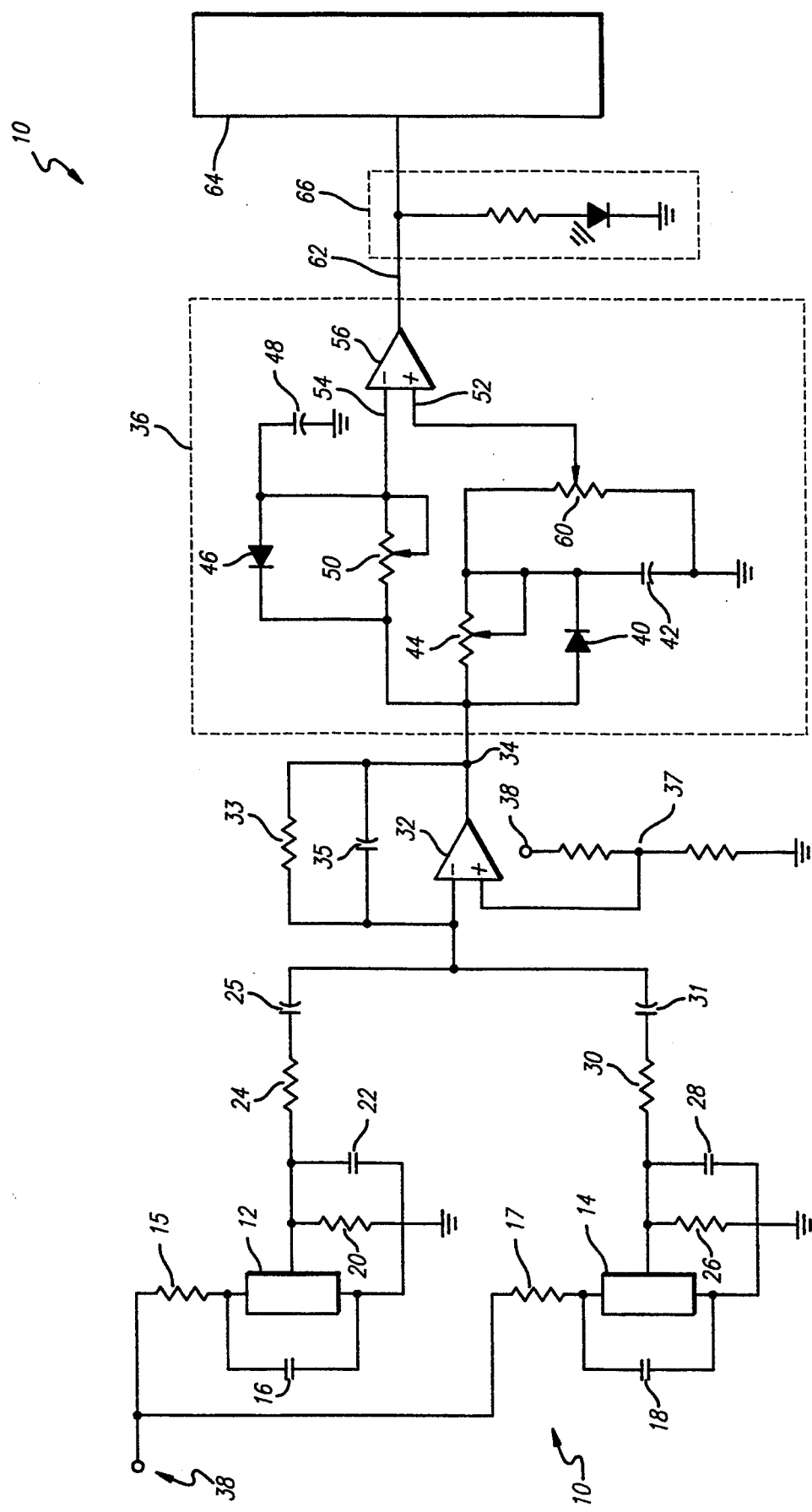
FIG. 1 is an electrical schematic of a rate of change comparator used to monitor the output of a pair of transducers in a motion or occupancy sensor according to the present invention.

FIG. 1 is an electrical schematic of a rate of change comparator used in a motion or occupancy sensor in which the output of a pair of passive infrared transducers are combined and applied to a rate of change comparator. The comparator indicates an event has been detected when the rate of change of the combined IR detector pair output exceeds a predetermined rate of change. A pair of passive infrared transducers are described in this embodiment for convenience but the present invention is not limited to such transducers and is useful with passive and active transducers of many types including infrared, ultrasonic and/or acoustic transducers and the like.

Circuit 10 includes a pair of passive infrared or IR transducers 12 and 14 powered from a DC supply applied at DC input 38 through RC filters formed by the series connection of resistor 15 and capacitor 16 and the series connection of resistor 17 and capacitor 18, respectively. The pair of IR transducers may be arranged to cover a wide field of view in a conventional manner and passively respond to the infrared energy in that field of view.

In a conventional manner, the output of each IR transducer may be filtered by a low pass, parallel resistor-capacitor filter, and a high pass series RC filter, before being combined in signal conditioning amplifier circuit 32. The low pass filters are formed by the parallel connection of resistor 20 and capacitor 22 and the parallel connection of resistor 26 and capacitor 28, respectively. The high pass filters are formed by the series connection of resistor 24 and capacitor 25 and the series connection of resistor 30 and capacitor 31, respectively.

Depending upon the application for which circuit 10 is designed and operated, circuit 32 may simply be an op amp used as a summing amplifier or may include additional signal conditioning circuitry. The filtered outputs of IR transducers 12 and 14 are combined at the inverting input of op amp 32 to which is also connected a parallel RC filter in the negative feedback path of the op amp. Resistor 33 and capacitor 35 form the negative feedback filter. The non-inverting input of op amp 32 is connected to a tap on voltage divider 37, which may be simply a pair of resistors in series connected between DC input 38 and ground, to provide a reference voltage level between DC input 38 and ground so that op amp 32 can operate from a single DC source in a conventional manner. The output 34 of signal conditioning op amp circuit 32 is applied to rate of change comparator 36.

Rate of change comparator 36, to be described below in greater detail, produces event detection output 62 which in a conventional manner is used to illuminate light emitting diode or LED 66 and activate response circuitry 64 which may be an alarm or other conventional circuit, such as a control circuit, designed to respond to an indication from the room transducers that the room is or is not occupied.

Rate of change comparator 36 includes op amp 56, used as a comparator, which along with op amp 32 may conveniently be a portion of a conventional and inexpensive LM324 quad op amp. Op amp 56 has an inverting input 54 and a non-inverting input 52. The output of op amp comparator 56 is used as the event detection output 62 of rate of change comparator 36. That is, when the voltage applied to non-inverting op amp input 52 substantially exceeds the voltage applied to inverting input 54, the output of op amp 56, event detection output 62, is positive or high indicating that an event has been detected. Alternately, when the voltage applied to inverting input 54 substantially exceeds the voltage applied to non-inverting input 52, event detection output 62, remains low indicating that an event has not been detected. A minimum threshold bias voltage is applied across the op amp inputs in order to prevent false triggering of the comparator by a signal which does not exceed the minimum rate of change sufficiently to exceed the threshold bias.

Op amp inputs 54 and 52 each include an RC time constant circuit formed from the series connections of resistor 50 and capacitor 48 and resistor 44 and capacitor 42, respectively. Resistor 50 is shunted by discharge diode 46 while resistor 44 is shunted by charging diode 40.

Capacitor 48 is connected directly to inverting input 54 while capacitor 42 is connected to non-inverting op amp input 52 through a tap on fixed or adjustable voltage divider 60 which is parallel with capacitor 42.

In steady state operation in which output 34 is not varying, capacitors 48 and 42 will be charged to the maximum voltage achievable through resistors 50 and 44 from the voltage available at combined transducer output 34. Assuming that the RC time constants are equal, the voltages across capacitors 48 and 42 will be the same, but the voltage applied to non-inverting op amp input 52 through voltage divider 60 will be slightly less than the voltage applied to inverting input 54 by capacitor 48. The voltage applied to the inverting input of op amp 56 will therefore be greater than the voltage applied to the non-inverting input, biasing the op amp in the low output or off condition and providing a minimum threshold amplitude which must be overcome to trigger the detection of an event to be detected.

During non-steady state conditions, when transducer output 34 varies positively, charging diode 40 will conduct and charge capacitor 42 faster than it would have charged through resistor 44. Under these conditions, discharge diode 46 will be reverse biased and capacitor 48 will charge through resistor 50 at a slower rate. If the voltage on capacitor 42 increases high enough so that the voltage at non-inverting op amp input 52 exceeds the voltage across capacitor 48 and therefore the voltage applied to inverting input 54, event detection output 62 of op amp 56 will be high, indicating that an event has been detected. That is, when transducer output 34 changes with a positive polarity at a rate fast enough, and for a time long enough, so that the voltage difference between capacitors 42 and 48 exceeds the threshold bias provided by the setting of voltage divider 60, this difference results in a change of state of event detection output 62 from low to high indicating that an event has been detected.

It should be noted that the threshold bias provided by the setting of voltage divider 60 thereby determines the minimum amplitude of change at a minimum rate of change of transducer output 34 required to produce a positive event detection output 62 in response to a change in transducer output 34 with a positive polarity.

Similarly, as will be described below, the setting of voltage divider 60 also determines the minimum amplitude of change at a minimum rate of change of transducer output 34 required to produce a positive event detection output 62 in response to a change in transducer output 34 with a negative polarity. In this manner, a change in transducer output 34 of either positive or negative polarity with regard to a predetermined reference level such as ground, results in a positive output 62 if the rate of change of that change exceeds a selectable threshold level.

Fast discharging resistor 50, and fast charging resistor 44, may each be separately adjustable, if desired, in order to provide a separate adjustment for the minimum rate of change required for positive and negative going changes in transducer output 34.

In particular, when transducer output 34 varies negatively, discharging diode 46 will conduct, discharging capacitor 48 faster than it would have discharged through resistor 44. Under these conditions, charging diode 46 will be reverse biased and capacitor 42 will discharge through resistor 44 at a slower rate based on the RC time constant of that circuit. If the voltage on capacitor 48, which is the voltage at inverting input 54, decreases below the voltage at non-inverting op amp input 52, a positive differential voltage will be applied across the input of op amp 56 causing event detection output 62 to become high, indicating that an event has been detected. That is, when transducer output 34 changes with a negative polarity at a rate fast enough so that the voltage difference between capacitors 42 and 48 exceeds the threshold bias provided by the setting of voltage divider 60, this difference results in a change of state of event detection output 62 from low to high indicating that an event has been detected.

Adjustment of voltage divider 60 thereby adjusts the bias threshold required by a changing input voltage of either polarity to trigger the detection of an event, such as motion in a room, as indicated by event detection output 62 while adjustment of either fast discharging resistor 50 or fast charging resistor 44 adjusts the minimum rate of change of transducer output 34 with a positive or negative polarity, respectively, to trigger an event detection. If transducer output 34 changes at a rate of change below the rates of change specified by the adjustments of resistors 44 and 50, no event will be detected because the voltages across capacitors 42 and 48 cannot differ substantially. If transducer output 34 changes at a rate of change above the minimum rate of change specified by the adjustments of either fast charging resistor 44 or fast discharging resistor 50, a voltage difference will appear across capacitors 42 and 48. If this voltage difference exceeds the minimum bias threshold voltage specified by the adjustment of voltage divider 60, the differential voltage will be applied to op amp 56, triggering event detection output 62.

The adjustment of voltage divider 60 provides a minimum threshold voltage which must be overcome by a change in transducer output 34 before event detection output 62 is triggered. In this way, unwanted false detections resulting from relatively high rate of change signals of short duration may be prevented. In other words, in order to trigger the detection of an event, transducer output 34 must exceed the specified minimum rate of change for a sufficient length of time by a sufficient magnitude so that the bias threshold voltage is exceeded. This feature can be used to filter out short duration changes exceeding the minimum rate of change to prevent false triggering. Event detection is thereby predicated on the provision of a minimum level of power at or above a minimum rate of change by transducer output 34.

While this invention has been described with reference to its presently preferred embodiment(s), its scope is not limited thereto. Rather, such scope is only limited insofar as defined by the following set of claims and all equivalents thereof. For example, the described embodiment illustrates the operation of the invention with regard to transducer output changes of positive and negative polarities with respect to a particular reference voltage, which for convenience of illustration was selected as the ground or zero voltage level. It is well within the skill in this art to select and use a different, non-zero voltage level as the reference voltage, that is, by using a fixed bias voltage as the reference voltage. Transducer output changes above this non-zero, bias voltage would be changes having a first or positive polarity and while transducer output changes below the bias voltage would have a second or negative polarity. Similarly, adjustable resistances have been shown in this embodiment for resistances 44, 50 and 60 but these may conveniently be replaced by fixed resistances if appropriate for the application.

What is claimed is:

1. A comparator, comprising:
   a fast charging circuit to produce a fast charging circuit voltage in response to an applied voltage signal having a variable rate of change, said fast charging circuit voltage increasing at a relatively fast charging rate when the applied voltage signal has a first polarity with respect to a reference voltage and decreasing at a relatively slower charging rate when the applied voltage signal has a second polarity with respect to the reference voltage;
   a fast discharging circuit to produce a fast discharging circuit voltage in response to the applied voltage signal, said fast discharging circuit voltage increasing at a relatively slow discharging rate when the applied voltage signal has the first polarity and decreasing at a relatively faster discharging rate when the applied voltage signal has the second polarity; and
   comparator means for comparing a first portion of said fast charging circuit voltage to a second portion of said fast discharging circuit voltage to produce an output signal when a change of the applied voltage signal exceeds a predetermined level.

2. The invention of claim 1, wherein the comparator means further comprises:
   threshold bias means for selecting said first and second portions to select a bias threshold for said predetermined level.

3. The invention of claim 2, wherein the threshold bias means further comprises:
   means for adjusting said first or second portion to adjust said threshold.

4. The invention of claim 2, wherein said threshold bias means further comprises:
   voltage divider means for reducing said fast charging or said fast discharging circuit voltage to form a reduced voltage as said first or second portion, respectively;
   connection means for connecting whichever of said fast charging or said fast discharging circuit voltage has not been reduced to form a reduced voltage, said connection means forming a connected voltage; and
   means for comparing said reduced and said connected voltages to generate said output signal.

5. The invention of claim 4, wherein said voltage divider means further comprises:
   means for adjusting the magnitude of said reducing in order to adjust said threshold.

6. The invention of claim 5, wherein said means for comparing further comprises:
   a differential amplifier responsive to said reduced and connected voltages to produce said output signal when the difference therebetween exceeds the difference between said reduced voltage and said fast charging or discharging voltage from which said reduced voltage had been formed.

7. The invention of claim 1, wherein said fast charging circuit further comprises:
   a first RC circuit including a charging resistance for charging at said slower charging rate when said applied voltage signal has said second polarity; and
   fast charge switching means for effectively reducing said charging resistance to cause said first RC circuit to charge at said fast charging rate when said signal has said first polarity.

8. The invention of claim 7, wherein said fast charge switching means further comprises:
   a first diode.

9. The invention of claim 7, wherein said charging resistance further comprises:
   means for adjusting said charging resistance for adjusting a minimum required rate of change for said applied voltage signal to generate said output signal when said applied voltage signal has said second polarity.

10. The invention of claim 1, wherein said fast discharging circuit further comprises:
    a second RC circuit including a discharging resistance for discharging at said slow discharge rate when said applied voltage signal has said second polarity; and
    fast discharge switching means for effectively reducing said discharging resistance to cause said first second RC circuit to discharge at said fast discharge rate when said signal has said first polarity.

11. The invention of claim 10, wherein said fast discharge switching means further comprises:
    a second diode.

12. The invention of claim 10, wherein said discharging resistance further comprises:
    means for adjusting said discharging resistance for adjusting a minimum required rate of change for said applied voltage signal to generate said output signal when said applied voltage signal has said first polarity.

13. A motion detector, comprising:
    means for producing a transducer signal responsive in magnitude and polarity to a motion to be detected;
    a fast charging circuit to produce a charging voltage in response to said transducer signal, said charging voltage increasing at a relatively fast charging circuit rate when the transducer signal has a first polarity and decreasing at a relatively slower charging circuit rate when the transducer signal has a second polarity;
    a fast discharging circuit to produce a discharging voltage in response to said transducer signal, said discharging voltage increasing at a relatively slow discharging circuit rate when the transducer signal has the first polarity and decreasing at a relatively faster discharging circuit rate when the transducer signal has the second polarity;

comparator means for comparing a first portion of said fast charging circuit voltage to a second portion of said fast discharging circuit voltage to produce an output signal if the rate of change of the transducer signal exceeds the relatively slow charging circuit rate when transducer signal has the first polarity or if the rate of change of the transducer signal exceeds the relatively slow discharging rate when the transducer signal has the second polarity; and means responsive to said output signal to indicate the detection of motion.

14. The invention of claim 13, wherein the comparator means further comprises:

threshold bias means for selecting said first and second portions to establish a bias threshold level required to produce the output signal.

15. The invention of claim 14, wherein the threshold bias means further comprises:

means for adjusting said first or second portion to adjust said bias threshold level.

16. The invention of claim 14, wherein said threshold bias means further comprises:

voltage divider means for reducing said fast charging or said fast discharging circuit voltage to form a reduced voltage as said first or second portion, respectively;

connection means for connecting whichever of said fast charging or said fast discharging circuit voltage has not been reduced, said connection means forming a connected voltage; and means for comparing said reduced and connected voltages to generate said output signal.

17. The invention of claim 16, wherein said voltage divider means further comprises:

means for adjusting the magnitude of said reducing in order to adjust said bias threshold level.

18. The invention of claim 17, wherein said means for comparing further comprises:

a differential amplifier responsive to said reduced and connected voltages to produce said output signal when the difference therebetween exceeds the difference between said reduced voltage and said fast charging or discharging voltage from which said reduced voltage had been formed.

19. The invention of claim 13, wherein said fast charging circuit further comprises:

a first RC circuit including a charging resistance for charging at said slower rate when said applied voltage signal has said second polarity; and fast charge switching means for effectively reducing said charging resistance to cause said first RC circuit to charge at said fast rate when said signal has said first polarity.

20. The invention of claim 19, wherein said fast charge switching means further comprises:

a first diode.

21. The invention of claim 19, wherein said charging resistance is adjustable.

22. The invention of claim 13, wherein said fast discharging circuit further comprises:

a second RC circuit including a discharging resistance for discharging at said slow discharge rate when said applied voltage signal has said second polarity; and fast discharge switching means for effectively reducing said discharging resistance to cause said first second RC circuit to discharge at said fast discharge rate when said signal has said first polarity.

23. The invention of claim 22, wherein said fast discharge switching means further comprises:

a second diode.

24. The invention of claim 22 wherein said discharging resistance is adjustable.

* * * * *